United States Patent
Asthana et al.

(10) Patent No.: US 10,418,124 B1
(45) Date of Patent: Sep. 17, 2019

(54) BYPASS CIRCUITRY FOR MEMORY APPLICATIONS

(71) Applicant: Arm Limited, Cambridge (GB)

(72) Inventors: Vivek Asthana, Noida (IN); Nitin Jindal, Noida (IN); Saikat Kumar Banik, Noida (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 15/904,292

(22) Filed: Feb. 23, 2018

(51) Int. Cl.
| | |
|---|---|
| G11C 7/06 | (2006.01) |
| G11C 29/00 | (2006.01) |
| G11C 7/10 | (2006.01) |
| G11C 8/06 | (2006.01) |
| G11C 8/12 | (2006.01) |
| G11C 29/56 | (2006.01) |
| G11C 29/28 | (2006.01) |
| G11C 16/04 | (2006.01) |
| G11C 29/12 | (2006.01) |
| G11C 29/14 | (2006.01) |

(52) U.S. Cl.
CPC .............. *G11C 29/84* (2013.01); *G11C 7/065* (2013.01); *G11C 7/1012* (2013.01); *G11C 8/06* (2013.01); *G11C 8/12* (2013.01); *G11C 16/04* (2013.01); *G11C 29/12* (2013.01); *G11C 29/1201* (2013.01); *G11C 29/14* (2013.01); *G11C 29/28* (2013.01); *G11C 29/56012* (2013.01); *G11C 29/848* (2013.01)

(58) Field of Classification Search
CPC ......... G11C 16/32; G11C 29/04; G11C 29/12; G11C 29/1201; G11C 29/14; G11C 29/28; G11C 29/56012; G11C 29/84; G11C 29/848
See application file for complete search history.

(56) References Cited

U.S. PATENT DOCUMENTS

| | | | | |
|---|---|---|---|---|
| 5,535,172 A | * | 7/1996 | Reddy | G11C 7/18 365/189.02 |
| 7,969,804 B1 | * | 6/2011 | Hirose | G11C 5/145 365/206 |
| 8,737,150 B2 | * | 5/2014 | Mochida | G01R 31/2856 365/201 |

* cited by examiner

*Primary Examiner* — Vanthu T Nguyen
(74) *Attorney, Agent, or Firm* — Pramudji Law Group PLLC; Ari Pramudji

(57) ABSTRACT

Various implementations described herein are directed to an integrated circuit having core circuitry with an array of bitcells arranged in columns of bitcells that may represent bits. A first column of bitcells may represent a nearest bit of the bits, and a last column of bitcells may represent a farthest bit of the bits. The integrated circuit may include sense amplifier circuitry coupled to the core circuitry to assist with accessing data stored in the array of bitcells. The integrated circuit may include multiplexer circuitry coupled to the sense amplifier circuitry. The integrated circuit may include first bypass circuitry coupled to outputs of the sense amplifier circuitry at the farthest bit. The integrated circuit may include second bypass circuitry coupled to an output of the multiplexer circuitry at the nearest bit.

17 Claims, 5 Drawing Sheets

BYPASS CIRCUITRY FOR MEMORY APPLICATIONS

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional circuit designs, memory sub-systems are typically restricted by various timing constraints. These memory sub-systems use shadow logic on its output that is followed by a flip-flop. Typical timing conditions are met so that there are no delay faults in the system. However, during testing of shadow logic, multiple conditions should be checked by using design-for-test (DFT) functionality of memory. However, in present designs, only one condition of an operating mode inside the memory is checked. Hence, there is only partial coverage of delay faults during conventional testing.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to bypass circuitry. For instance, some implementations described herein are related to bypass techniques and/or schemes for various memory circuitry applications, such as, e.g., static random access memory (SRAM), for increased delay fault coverage. In reference to single bank memory, bypass mode access time=normal mode access time, bypass mode retain time=normal mode retain time (e.g., for mux2, mux4), and bypass mode retain time≠normal mode retain time (e.g., for mux8, mux16). Bypass circuitry described herein may be configured to implement various bypass modes, schemes and techniques differently for bits nearest to control block circuitry as compared to bits farthest from control block circuitry so that access delays and/or retain delays in bypass mode are equal (or at least similar) to that in the normal mode of operation. For the single bank memory, D (data input) to Q (data output) bypass may be implemented at the sense amplifier (SA) latch for the farthest bit and at the sense amplifier (SA) multiplexer (mux8, mux16) for the nearest bits.

Similarly, in reference to multiple bank memory, bypass mode access time=normal mode access time (e.g., if bypass is implemented in a last bank) and bypass mode retain time≠normal mode retain time. For multi-bank memory, D (data input) to Q (data output) bypass may be implemented at the sense amplifier (SA) latch for the farthest bit in an upper/top bank and at the bank outputs multiplexer (global iodrv) for the nearest bits. These various implementations may ensure maximum (or upper-bounded) access delay for the farthest bits and minimum (or lower-bounded) retain delay for the nearest bits in the bypass mode. These various implementations may further ensure that access delays and retain delays match in the normal mode of operation.

Various implementations of bypass circuitry will now be described in detail herein with reference to FIGS. 1-5.

Figure 1:
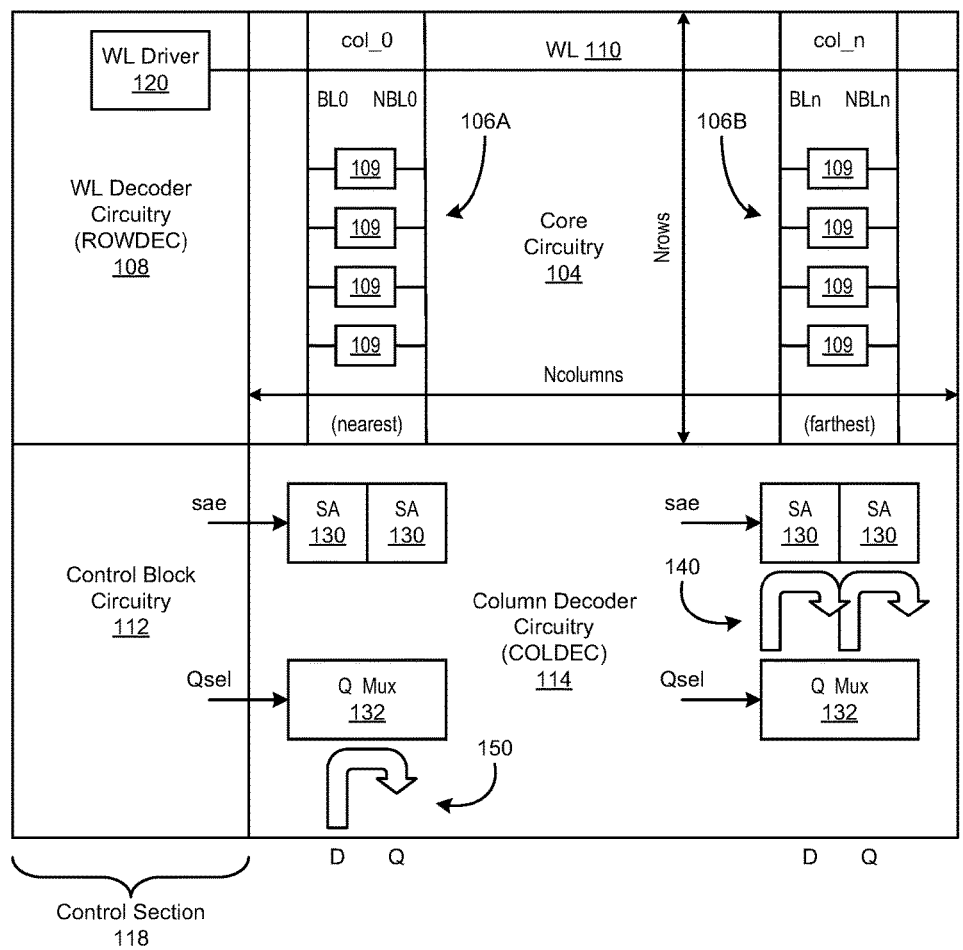
FIG. 1 illustrates a diagram of single bank memory circuitry having bypass in accordance with various implementations described herein.

FIG. 1 illustrates a diagram of single bank memory circuitry 100 in accordance with various implementations described herein. In this instance, the memory circuitry 100 includes core circuitry 104 as a single bank of memory cells (or bitcells) 109.

As shown in FIG. 1, the memory circuitry 100 includes memory, such as, e.g., the core circuitry 104 having one or more arrays of bitcells, including a first array 106A of bitcells 109 and a second array 106B of bitcells 109. The arrays 106A, 106B of bitcells 109 may include columns of bitcells (col_0, . . . , col_n) that represent bits, including a first column (col_0) of bitcells that represents a nearest bit of the bits, and a last column (col_n) of bitcells that represent a farthest bit of the bits. In various instances presented herein, the terms "nearest" and "farthest" are in reference to their position with respect to a control section 118 of the memory circuitry 100.

The memory circuitry 100 may be implemented as an integrated circuit (IC) in using various types of memory, such as, e.g., random access memory (RAM), including static RAM (SRAM), and/or any other types of volatile memory. In some implementations, the memory circuitry 100 may be implemented as an IC with dual rail memory architecture and related circuitry. The memory circuitry 100 may be integrated with computing circuitry and related components on a single chip. The memory circuitry 100 may be implemented in embedded systems for various electronic and mobile applications, including low power sensor nodes for IoT (Internet of things) applications.

The core circuitry 104 includes the arrays 106A, 106B of bitcells 109, wherein each bitcell may be referred to as a memory cell. Each bitcell 109 may be configured to store at least one data bit value (e.g., data value related to a logical '0' or '1'). Each array 106A, 106B of bitcells 109 may include any number of bitcells 109 arranged in various configurations, such as, e.g., a two-dimensional (2D) memory array having any number of columns (Ncolumns) and any number of rows (Nrows) of multiple bitcells 109, which may be arranged in a 2D grid pattern with 2D indexing capabilities. Each bitcell 109 may be implemented with random access memory (RAM) circuitry, and/or some other type of volatile type memory. For instance, each bitcell 109 may include a multi-transistor static RAM (SRAM) cell, including various types of SRAM cells, such as, e.g., 6T CMOS SRAM and/or other types of complementary MOS (CMOS) SRAM cells, such as, e.g., 4T, 8T, 10T, or more transistors per bit. In some instances, the memory circuitry 100 may operate at a source voltage level VDD with a voltage range that varies with technology.

The memory circuitry 100 may include wordline (WL) row decoder circuitry 108 (ROWDEC) that accesses each of the bitcells 109 via a selected wordline (WL) 110 that is driven by wordline (WL) driver circuitry 120. The combination of WL decoder 108 and WL driver circuitry 120 may be referred to as (wdx). In some instances, the memory circuitry 100 (including the core 104, the bitcells 109, and the row decoder 108) may operate at a first supply voltage, such as, e.g., a core supply voltage VDDC. The voltage range varies with technology. In some other instances, the row decoder 108 may operate at the core supply voltage VDDC, and other components, such as, e.g., the WL driver circuitry 120 may generate a wordline signal at a second supply voltage that may be different than the first or core supply voltage VDDC, such as, e.g., a periphery supply voltage VDDP.

The memory circuitry 100 may include periphery circuitry having control block circuitry 112 and column decoder circuitry 114 (COLDEC), such as, e.g., input/output (I/O) circuitry that is used to access each of the bitcells 109 via one or more selected bitlines BL, . . . , BLn. In some instances, the selected bitlines BL, . . . , BLn may include a selected pair of complementary bitlines BL/NBL, . . . , BLn/NBLn. In other instances, the periphery circuitry may include the row decoder (ROWDEC) 108 coupled to the WL driver circuitry 120 and the column decoder (COLDEC) 114 to select at least one bitcell 109 in the arrays 106A, 106B of bitcells 109 with a wordline (WL) signal and a bitline (BL) signal. The periphery circuitry may operate at the second or periphery supply voltage VDDP, that is different than a core supply voltage VDDC. The voltage range varies with technology. The column decoder (COLDEC) 114 may also operate at the periphery supply voltage VDDP, and the column decoder (COLDEC) 114 and/or components associated therewith (e.g., 130, 132, 140, 150) may receive one or more data signals (D) and one or more other I/O signals (Q).

The memory circuitry 100 may include sense amplifier circuitry 130 coupled to the core circuitry 104 to assist with accessing data stored in the array of bitcells 106A, 106B, 109. The sense amplifier circuitry 130 may be part of the column decoder circuitry 114 (COLDEC). Further, the memory circuitry 100 may include multiplexer circuitry 132 coupled to the sense amplifier circuitry 130. The multiplexer circuitry 132 may be part of the column decoder circuitry 114 (COLDEC).

The memory circuitry 100 may also include first bypass circuitry 140 coupled to outputs of the sense amplifier (SA) circuitry 130 at the farthest bit. At the SA level, the sense amplifier circuitry 130 may be coupled to the control block circuitry 112. As shown in FIG. 1, the last column of bitcells (col_n) is farther away from the control block circuitry 112 than the first column of bitcells (col_0) such that the farthest bit of the bits is farther away from the control block circuitry 112 than the nearest bit of the bits. The first bypass circuitry 140 is further described herein in reference to FIG. 2.

The memory circuitry 100 may also include second bypass circuitry 150 coupled to an output of the multiplexer (Q_Mux) circuitry 132 at the nearest bit. At the Q_Mux level, the multiplexer circuitry 132 may be coupled to the control block circuitry 112. As shown in FIG. 1, the first column of bitcells (col_0) is closer to the control block circuitry 112 than the last column of bitcells (col_n) such that the nearest bit of the bits is closer to the control block circuitry 112 than the farthest bit of the bits. The second bypass circuitry 150 is further described herein in reference to FIG. 3.

As described herein, with respect to single bank memory, bypass mode access time=normal mode access time, bypass mode retain time=normal mode retain time (e.g., for mux2, mux4), and bypass mode retain time≠normal mode retain time (e.g., for mux8, mux16). The single bank bypass circuitry described herein may be configured to implement various bypass modes, schemes and techniques differently for bits nearest to control block circuitry as compared to bits farthest from control block circuitry so that access delays and/or retain delays in bypass mode are equal (or at least similar) to that in the normal mode of operation. For the single bank memory, D (data input) to Q (data output) bypass may be implemented at the sense amplifier (SA) latch for the farthest bit and at the sense amplifier (SA) multiplexer (mux8, mux16) for the nearest bits.

Figure 2:
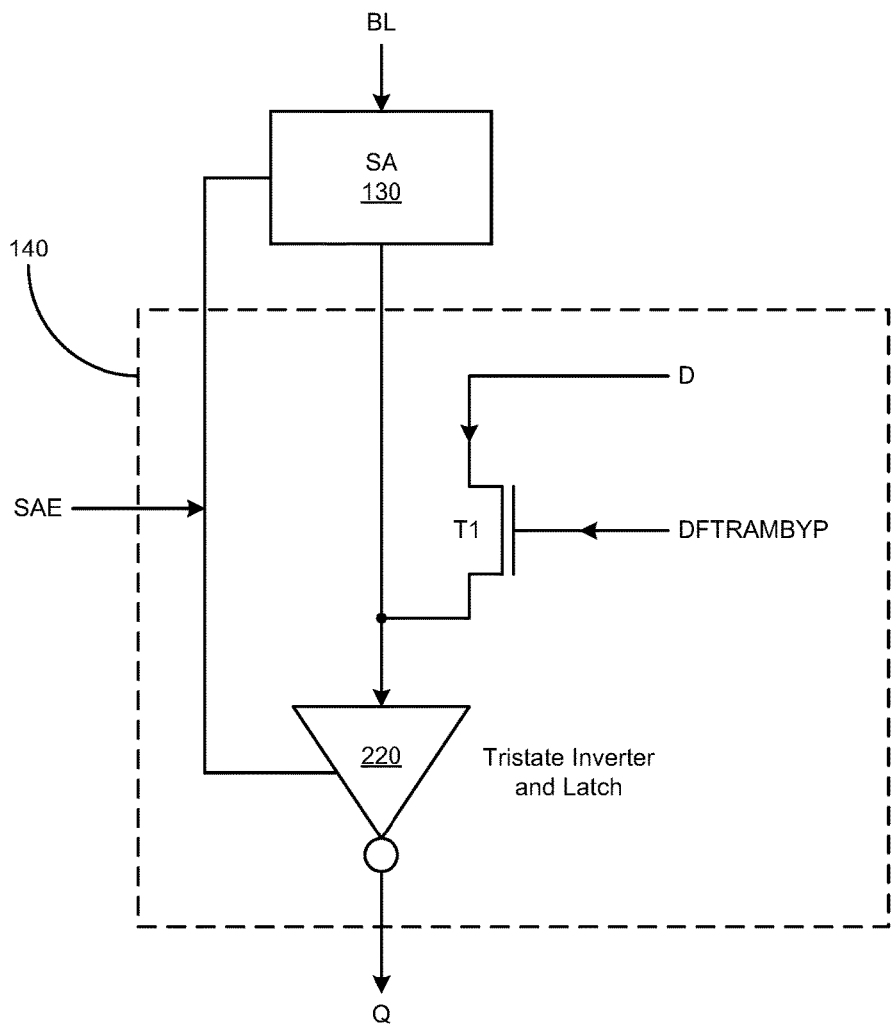
FIG. 2 illustrates a diagram of bypass circuitry associated with sense amplifier (SA) circuitry in accordance with various implementations described herein.

FIG. 2 illustrates a diagram 200 of first bypass circuitry 140 associated with sense amplifier (SA) circuitry in accordance with implementations described herein.

As shown in FIG. 2, the first bypass circuitry 140 may be coupled to the sense amplifier (SA) circuitry 130, wherein the SA circuitry 130 is coupled to and receives input from a corresponding bitline (BL). In some implementations, the first bypass circuitry 140 may include a transistor T1 and a tristate inverter 220 having a latch. The transistor T1 be embodied with an N-type metal-oxide-semiconductor (NMOS) transistor. However, a P-type MOS (PMOS) transistor may otherwise be used in some other configuration. The first bypass circuitry 140 (e.g., transistor T1) may be activated based on a first bypass control signal (DFTRAMBYP) that may be provided by control circuitry (e.g., control block circuitry 112 of FIG. 1). The transistor T1 may be coupled between the SA circuitry 130 and the tristate inverter 220. The transistor T1 may pass an input data signal (D) based on the first bypass control signal (DFTRAMBYP). The SA circuitry 130 and the tristate inverter 220 may operate based on a sense amplifier enable (SAE) signal. When enabled, the tristate inverter 220 may provide an output data signal (Q) based on an output signal from the SA circuitry 130 and/or the data input signal (D) that is passed by the transistor T1 when activated by the first bypass control signal (DFTRAMBYP).

Figure 3:
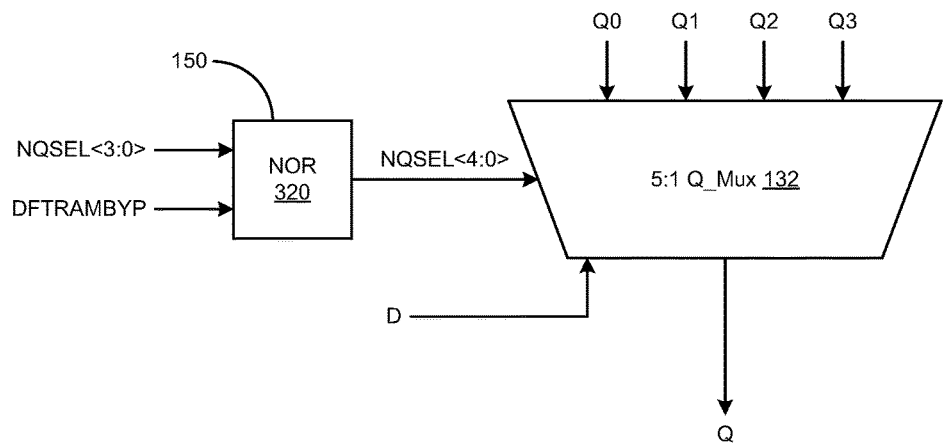
FIG. 3 illustrates a diagram of bypass circuitry associated with multiplexer (MUX) circuitry in accordance with various implementations described herein.

FIG. 3 illustrates a diagram 300 of second bypass circuitry 150 associated with multiplexer circuitry 132 in accordance with implementations described herein.

As shown in FIG. 3, the second bypass circuitry 150 may be coupled to the multiplexer circuitry 132, wherein the multiplexer circuitry 132 is coupled to and receives input from multiple Q signal lines Q0, Q1, Q2, Q3. In some implementations, the second bypass circuitry 150 may include a logic gate 320 that receives the first bypass control signal (DFTRAMBYP) and a second bypass control signal (NQSEL<3:0>) that is different than the first bypass control signal (DFTRAMBYP). The logic gate 320 may be embodied with a NOR gate. However, various other types of gates (e.g., NOT, OR, AND, NAND, etc.) may be used in different single or combinational configurations. The second bypass circuitry 150 may be activated based on the first bypass control signal (DFTRAMBYP) and/or the second bypass control signal (NQSEL<3:0>), which may be provided by the control circuitry (e.g., control block circuitry 112 of FIG. 1). The second bypass control signal (NQSEL<3:0>) is different from the first bypass control signal (DFTRAMBYP). The second bypass circuitry 150 may provide a selection control signal (NQSEL<4:0>) to the multiplexer circuitry 132 based on the first bypass control signal (DF-TRAMBYP) and/or the second bypass control signal (NQ-SEL<3:0>). In some instances, as shown in FIG. 3, the multiplexer circuitry 150 may be embodied with a 5:1 Q_Mux, or some other similar type of Mux. The multiplexer circuitry 132 may provide an output signal (Q) at the output thereof based on the received signals (e.g., Q0, Q1, Q2, Q3) from the SA circuitry 130, the data input signal (D), and/or the selection control signal (NQSEL<4:0>).

Figure 4:
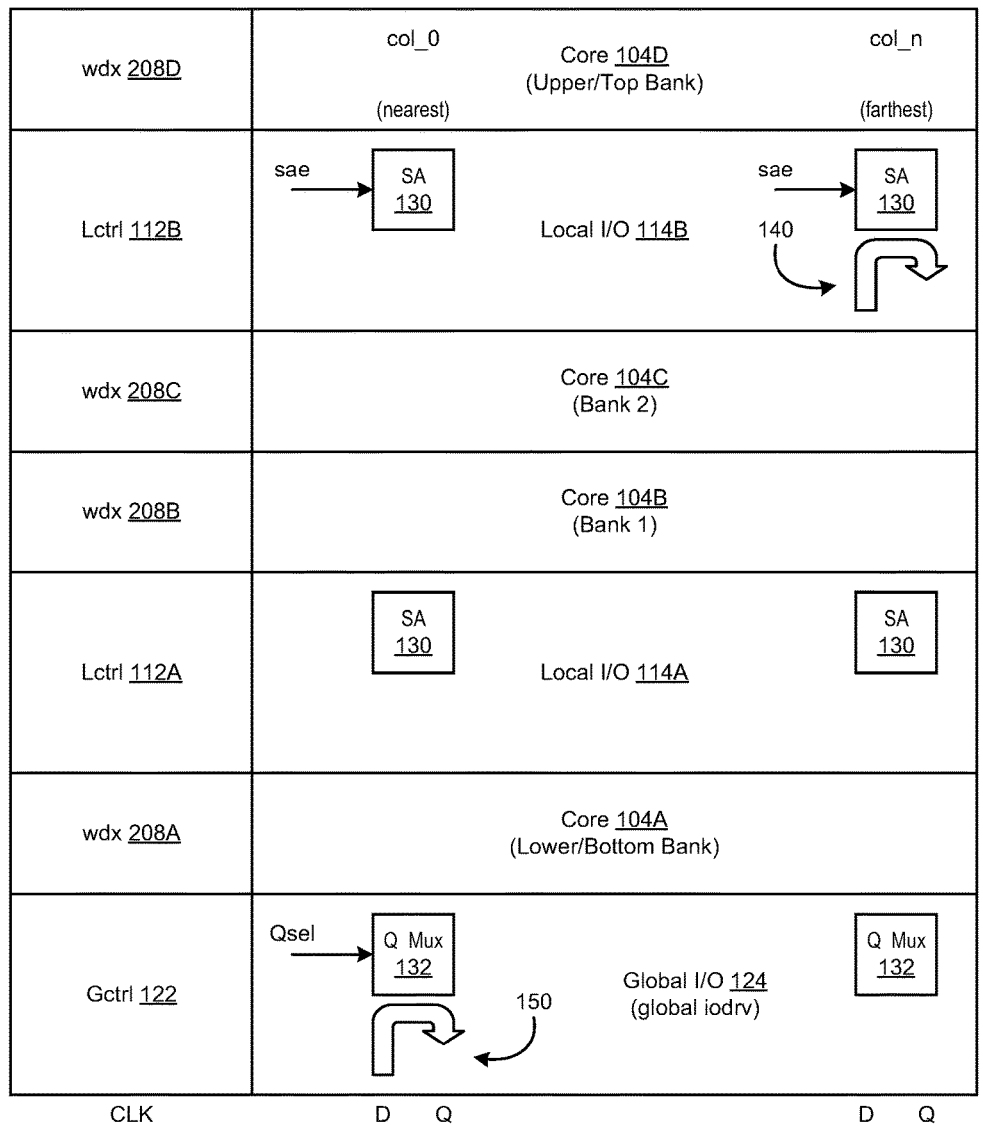
FIG. 4 illustrates a diagram of multi-bank memory circuitry having bypass in accordance with various implementations described herein.

FIG. 4 illustrates a diagram of multi-bank memory circuitry 400 having bypass in accordance with various implementations described herein. The memory circuitry 100 includes core circuitry 104 that is implemented as a multi-bank of memory cells (or bitcells) 109 with multiple cores 104A, 104B, 104C, 104D.

As shown in FIG. 4, the memory circuitry 400 may include the multiple banks of bitcells 104A, 104B, 104C, 104D, and in this instance, each bank of bitcells 104A, 104B, 104C, 104D includes columns of bitcells that represent bits. Further, each bank of bitcells 104A, 104B, 104C, 104D has a first column of bitcells that represent a nearest bit of the bits, and each bank of bitcells 104A, 104B, 104C, 104D has a last column of bitcells that represent a farthest bit of the bits.

The memory circuitry 400 may include WL row decoder/driver (wdx) circuitry 208A, 208B, 208C, 208D that accesses each of the bitcells in corresponding banks/cores 104A, 104B, 104C, 104D via a selected wordline (WL) that is driven by WL driver circuitry. As described herein above, the combination of a WL decoder and a WL driver may be referred to as (wdx).

The memory circuitry 400 may include column decoder circuitry that is implemented with multiple local input/output (I/O) circuits 114A, 114B, that may be used to access bitcells in each of the bank of bitcells 104A, 104B, 104C, 104D. In this instance, each of the local IO circuits 114A, 114B, may include sense amplifier circuitry 130 that is coupled to corresponding banks of the multiple banks of bitcells 104A, 104B, 104C, 104D to assist with accessing data in the memory circuitry 400.

The memory circuitry 400 may also include a global IO multiplexer circuit 124 having multiple multiplexer circuits 132 that are coupled to outputs of corresponding sense amplifiers 130 of the multiple local IO circuits 114A, 114B. The memory circuitry 400 includes multiple local control circuits (Lctrl) 112A, 112B that are coupled to corresponding sense amplifier circuitry 130 of the local IO circuits 114A, 114B. The memory circuitry 400 may also include a global control circuit (Gctrl) 122 that is coupled to the multiple multiplexer circuits 132 of the global IO multiplexer circuit 124.

The memory circuitry 400 may further include the first bypass circuitry 140 coupled to the sense amplifier circuitry 130 at the farthest bit (col_n) of the farthest bank 104D. As described herein, the first bypass circuitry 140 may be activated based on a first bypass control signal (DFTRAMBYP) provided by the multiple local control circuits (Lctrl) 112A, 112B and/or the global control circuit (Gctrl) 122.

The memory circuitry 400 may also include the second bypass circuitry 150 coupled to an output of the global IO multiplexer circuit 124 at the nearest bit (col_0). As described herein, the second bypass circuitry 150 may be activated based on a second bypass control signal (NQSEL<3:0>) provided by the global control circuit (Gctrl) 122. The second bypass control signal (NQSEL<3:0>) is different from the first bypass control signal (DFTRAMBYP).

As shown in FIG. 4, the last column of bitcells (col_n) of the upper/top bank 104D is farther away from the global control circuit (Gctrl) 122 than the first column of bitcells (col_0) such that the farthest bit of the bits is farther away from the global control circuit (Gctrl) 122 than the nearest bit of the bits. Further, i.e., the first column of bitcells (col_0) of the lower/bot bank 104A is closer to the global control circuit (Gctrl) 122 than the last column of bitcells (col_n) such that the nearest bit of the bits is closer to the global control circuit (Gctrl) 122 than the farthest bit of the bits.

As described herein, with respect to multi-bank memory, bypass mode access time=normal mode access time (e.g., if bypass is implemented in a last bank) and bypass mode retain time≠normal mode retain time. For multi-bank memory, D (data input) to Q (data output) bypass may be implemented at the sense amplifier (SA) latch for the farthest bit in an upper/top bank and at the bank outputs multiplexer (global iodrv) for the nearest bits. These various implementations may ensure maximum (or upper-bounded) access delay for the farthest bits and minimum (or lower-bounded) retain delay for the nearest bits in the bypass mode. These various implementations may further ensure that access delays and retain delays match in the normal mode of operation.

Figure 5:
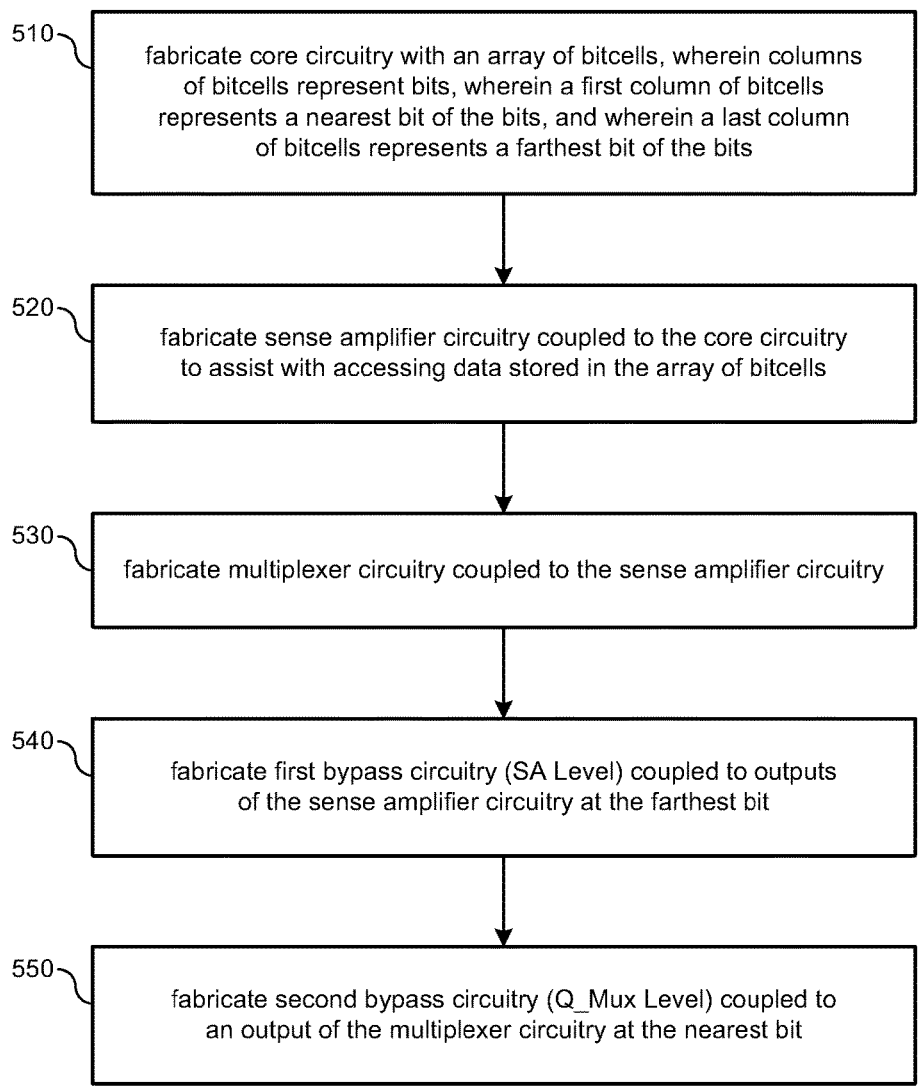
FIG. 5 illustrates a process flow diagram of a method for manufacturing an integrated circuit in accordance with various implementations described herein.

FIG. 5 illustrates a process flow diagram of a method 500 for manufacturing an integrated circuit in accordance with various implementations described herein.

It should be understood that even though method 500 may indicate a particular order of operation execution, in some cases, various certain portions of the operations may be executed in a different order, and on different systems. In other cases, additional operations and/or steps may be added to and/or omitted from method 500. Method 500 may be implemented in hardware and/or software. If implemented in hardware, the method 500 may be implemented with various circuit components, such as described herein above in reference to FIGS. 1-4. If implemented in software, method 500 may be implemented as a program or software instruction process that may be configured for implementing bypass circuitry as described herein. Further, if implemented in software, instructions related to implementing the method 500 may be stored in memory and/or a database. For instance, a computer or various other types of computing devices having a processor and memory may be configured to perform method 500.

As described and shown in reference to FIG. 5, method 500 may be used for manufacturing an integrated circuit (IC) that implements bypass circuitry in various types of memory applications. At block 510, method 500 may fabricate core circuitry with an array of bitcells having columns of bitcells that represent bits such that a first column of bitcells represents a nearest bit of the bits and a last column of bitcells represents a farthest bit of the bits (with respect to control circuitry section). At block 520, method 500 may fabricate sense amplifier circuitry coupled to the core circuitry to assist with accessing data stored in the array of bitcells. At block 530, method 500 may fabricate multiplexer circuitry coupled to the sense amplifier circuitry. At block 540, method 500 may fabricate first bypass circuitry (SA Level) coupled to outputs of the sense amplifier circuitry at the farthest bit. At block 550, method 500 may fabricate second bypass circuitry (Q_Mux Level) coupled to an output of the multiplexer circuitry at the nearest bit.

In some implementations, method 500 may also fabricate control circuitry that is coupled to the sense amplifier circuitry and the multiplexer circuitry. The last column of bitcells may be farther away from the control circuitry than the first column of bitcells such that the farthest bit of the bits is farther away from the control circuitry than the nearest bit of the bits. The first bypass circuitry is activated based on a first bypass control signal provided by the control circuitry. The second bypass circuitry is activated based on a second bypass control signal provided by the control circuitry, and the second bypass control signal is different from the first bypass control signal.

In some implementations, the first bypass circuitry may include a transistor and a tristate inverter having a latch. The transistor may be coupled between the sense amplifier circuitry and the tristate inverter. The transistor may pass a data signal based on a first bypass control signal. The sense amplifier circuitry and the tristate inverter may operate based on a sense amplifier enable signal.

In some implementations, the second bypass circuitry may include a logic gate that receives a first bypass control signal and a second bypass control signal that is different than the first bypass control signal. The logic gate may include a NOR gate. The second bypass circuitry may provide a selection control signal to the multiplexer circuitry based on the first bypass control signal and the second bypass control signal. The multiplexer circuitry may provide an output signal at the output thereof based on the outputs of the sense amplifier circuitry, a data signal, and the selection control signal.

Described herein are various implementations of an integrated circuit. The integrated circuit may include core circuitry having an array of bitcells with columns of bitcells that may represent bits. In this instance, a first column of bitcells may represent a nearest bit of the bits, and a last column of bitcells may represent a farthest bit of the bits. The integrated circuit may include sense amplifier circuitry coupled to the core circuitry to assist with accessing data stored in the array of bitcells. The integrated circuit may include multiplexer circuitry coupled to the sense amplifier circuitry. The integrated circuit may include first bypass circuitry coupled to outputs of the sense amplifier circuitry at the farthest bit. The integrated circuit may include second bypass circuitry coupled to an output of the multiplexer circuitry at the nearest bit.

Described herein are various implementations of an integrated circuit. The integrated circuit may include memory circuitry having multiple banks of bitcells, wherein each bank of bitcells has columns of bitcells that represent bits, each bank of bitcells has a first column of bitcells that represents a nearest bit of the bits, and each bank of bitcells has a last column of bitcells that represents a farthest bit of the bits. The integrated circuit may include multiple local input/output (IO) circuits, wherein each local IO circuit includes sense amplifier circuitry coupled to corresponding banks of the multiple banks of bitcells to assist with accessing data in the memory circuitry. The integrated circuit may include a global IO multiplexer circuit having multiple multiplexer circuits coupled to outputs of corresponding sense amplifiers of the multiple local IO circuits. The integrated circuit may include first bypass circuitry coupled to the sense amplifier circuitry at the farthest bit of the farthest bank. The integrated circuit may include second bypass circuitry coupled to an output of the global IO multiplexer circuit at the nearest bit.

Described herein are various implementations of a method for manufacturing or fabricating an integrated circuit. The method may include fabricating core circuitry with an array of bitcells, wherein columns of bitcells represent bits, a first column of bitcells represents a nearest bit of the bits, and a last column of bitcells represents a farthest bit of the bits. The method may include fabricating sense amplifier circuitry coupled to the core circuitry to assist with accessing data stored in the array of bitcells. The method may include fabricating multiplexer circuitry coupled to the sense amplifier circuitry. The method may include fabricating first bypass circuitry coupled to outputs of the sense amplifier circuitry at the farthest bit. The method may include fabricating second bypass circuitry coupled to an output of the multiplexer circuitry at the nearest bit.

The above referenced summary section is provided to introduce a selection of concepts in a simplified form that are further described below in the detailed description section. The summary is not intended to identify key features or essential features of the claimed subject matter, nor is it intended to be used to limit the scope of the claimed subject matter. Moreover, the claimed subject matter is not limited to implementations that solve any or all disadvantages noted in any part of this disclosure.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   core circuitry having an array of bitcells, wherein columns of bitcells represent bits, wherein a first column of bitcells represents a nearest bit of the bits, and wherein a last column of bitcells represents a farthest bit of the bits;
   sense amplifier circuitry coupled to the core circuitry to assist with accessing data stored in the array of bitcells;
   multiplexer circuitry coupled to the sense amplifier circuitry;
   control circuitry coupled to the sense amplifier circuitry and the multiplexer circuitry, wherein the last column of bitcells is farther away from the control circuitry than the first column of bitcells such that the farthest bit of the bits is farther away from the control circuitry than the nearest bit of the bits;
   first bypass circuitry coupled to an output of the sense amplifier circuitry at the farthest bit so as to receive an output signal from the sense amplifier circuitry and provide an output data signal based on the output signal from the sense amplifier circuitry; and
   second bypass circuitry coupled to the multiplexer circuitry at the nearest bit.

2. The integrated circuit of claim 1, wherein the first bypass circuitry is activated based on a first bypass control signal provided by the control circuitry.

3. The integrated circuit of claim 2, wherein the second bypass circuitry is activated based on a second bypass control signal provided by the control circuitry, and wherein the second bypass control signal is different from the first bypass control signal.

4. The integrated circuit of claim 1, wherein the first bypass circuitry comprises a transistor and a tristate inverter having a latch.

5. The integrated circuit of claim 4, wherein the transistor is coupled between the sense amplifier circuitry and the tristate inverter.

6. The integrated circuit of claim 4, wherein the transistor passes a data signal based on a first bypass control signal.

7. The integrated circuit of claim 4, wherein the sense amplifier circuitry and the tristate inverter operate based on a sense amplifier enable signal.

8. The integrated circuit of claim 1, wherein the second bypass circuitry comprises a logic gate that receives a first bypass control signal and a second bypass control signal that is different than the first bypass control signal.

9. The integrated circuit of claim 8, wherein the logic gate comprises a NOR gate.

10. The integrated circuit of claim 8, wherein the second bypass circuitry provides a selection control signal to the multiplexer circuitry based on the first bypass control signal and the second bypass control signal.

11. The integrated circuit of claim 10, wherein the multiplexer circuitry provides an output signal at an output thereof based on the outputs of the sense amplifier circuitry, a data signal, and the selection control signal.

12. An integrated circuit, comprising:
    memory circuitry having multiple banks of bitcells, wherein each bank of bitcells has columns of bitcells that represent bits, wherein each bank of bitcells has a first column of bitcells that represents a nearest bit of the bits, and wherein each bank of bitcells has a last column of bitcells that represents a farthest bit of the bits;
    multiple local input/output (IO) circuits, wherein each local IO circuit includes sense amplifier circuitry coupled to corresponding banks of the multiple banks of bitcells to assist with accessing data in the memory circuitry;
    a global IO multiplexer circuit having multiple multiplexer circuits coupled to outputs of corresponding sense amplifiers of the multiple local IO circuits;
    a global control circuit coupled to the multiple multiplexer circuits of the global IO multiplexer circuit, wherein the last column of bitcells of an upper bank is farther away from the global control circuit than the first column of bitcells such that the farthest bit of the bits is farther away from the global control circuit than the nearest bit of the bits;
    first bypass circuitry coupled to the sense amplifier circuitry at the farthest bit of the farthest bank to receive an output signal from the sense amplifier circuitry and provide an output data signal based on the output signal from the sense amplifier circuitry; and
    second bypass circuitry coupled to the global IO multiplexer circuit at the nearest bit.

13. The integrated circuit of claim 12, further comprising:
    multiple local control circuits coupled to corresponding sense amplifier circuitry of the local IO circuits.

14. The integrated circuit of claim 13, wherein the first bypass circuitry is activated based on a first bypass control signal provided by the multiple local control circuits and/or the global control circuit.

15. The integrated circuit of claim 14, wherein the second bypass circuitry is activated based on a second bypass control signal provided by the global control circuit, and wherein the second bypass control signal is different from the first bypass control signal.

16. The integrated circuit of claim 15, wherein:
    the first bypass circuitry has a transistor and a tristate inverter with a latch,
    the transistor passes a data signal based on a first bypass control signal, the second bypass circuitry has a logic gate that receives the first bypass control signal and a second bypass control signal that is different than the first bypass control signal, and the second bypass circuitry provides a selection control signal to the multiple multiplexer circuits based on the first bypass control signal and the second bypass control signal.

17. A method of fabricating an integrated circuit, comprising:

fabricating core circuitry with an array of bitcells, wherein columns of bitcells represent bits, wherein a first column of bitcells represents a nearest bit of the bits, and wherein a last column of bitcells represents a farthest bit of the bits;

fabricating sense amplifier circuitry coupled to the core circuitry to assist with accessing data stored in the array of bitcells;

fabricating multiplexer circuitry coupled to the sense amplifier circuitry;

fabricating control circuitry coupled to the sense amplifier circuitry and the multiplexer circuitry, wherein the last column of bitcells is farther away from the control circuitry than the first column of bitcells such that the farthest bit of the bits is farther away from the control circuitry than the nearest bit of the bits;

fabricating first bypass circuitry coupled to outputs of the sense amplifier circuitry at the farthest bit to receive an output signal from the sense amplifier circuitry and provide an output data signal based on the output signal from the sense amplifier circuitry; and fabricating second bypass circuitry coupled to the multiplexer circuitry at the nearest bit.

* * * * *